United States Patent [19]
Anthony et al.

[11] Patent Number: 5,672,395
[45] Date of Patent: Sep. 30, 1997

[54] METHOD FOR ENHANCING THE TOUGHNESS OF CVD DIAMOND

[75] Inventors: Thomas R. Anthony, Schenectady, N.Y.; William F. Banholzer, Columbus, Ohio; Clifford L. Spiro, Niskayuna, N.Y.; Steven W. Webb; Bradley E. Williams, both of Worthington, Ohio

[73] Assignee: General Electric Company, Pittsfield, Mass.

[21] Appl. No.: 654,815

[22] Filed: May 29, 1996

Related U.S. Application Data

[63] Continuation of Ser. No. 238,545, May 5, 1994, abandoned.

[51] Int. Cl.$^6$ ............................................. B05D 3/00
[52] U.S. Cl. .................... 427/444; 427/249; 427/577; 427/372.2
[58] Field of Search .......................... 427/249, 577, 427/372.2, 444; 423/446

[56] References Cited

U.S. PATENT DOCUMENTS

| | | |
|---|---|---|
| 4,124,690 | 11/1978 | Strong et al. . |
| 4,174,380 | 11/1979 | Strong et al. . |
| 4,181,505 | 1/1980 | De Vries et al. ............... 51/307 |
| 4,296,144 | 10/1981 | Maby et al. ................. 427/531 |
| 4,839,195 | 6/1989 | Kitamura et al. ............ 427/573 |
| 5,110,579 | 5/1992 | Anthony et al. ............. 423/446 |
| 5,371,383 | 12/1994 | Miyata et al. ............... 427/249 |

FOREIGN PATENT DOCUMENTS

| | | |
|---|---|---|
| 27 32 211 A1 | 7/1977 | Germany . |
| 63-226197 | 9/1988 | Japan . |

OTHER PUBLICATIONS

Graphitization of diamond at zero pressure and at a high pressure. By G. Davies and T. Evans J.J. Thomson Physical Laboratory, Berkshire, England Proc. R. Soc. Lond. A. 328 pp. 413–427 1972.

Plastic Deformation and "Work–Hardening" of Diamond. by R. C. DeVries Mat. Res. Bull. vol. 10 No. 11 pp. 1193–1200, 1975.

*Primary Examiner*—Roy V. King

[57] ABSTRACT

A method for treating as as-grown chemical vapor deposited (CVD) starting diamond film having stresses and containing voids, comprises the step of subjecting the diamond film to a temperature of above about 1000° C. and a hydrostatic pressure of above about 3 kilobars.

11 Claims, 1 Drawing Sheet

METHOD FOR ENHANCING THE TOUGHNESS OF CVD DIAMOND

This is a continuation of of application Ser. No. 08/238,545 filed on May 5, 1994, now abandoned.

TECHNICAL FIELD OF THE INVENTION

The present invention relates to a process for enhancing the properties of low pressure chemical vapor deposited (CVD) diamond and the enhanced product resulting from such treatment.

BACKGROUND OF THE INVENTION

When diamond is chemically vapor deposited, large intrinsic tensile stresses are typically present. At the usual temperatures of CVD diamond deposition at 750 to 900 degrees Centigrade, diamond is a brittle material and will not plastically flow. As a result, these deposition stresses can not relax. The presence of these stresses can be seen in polarized optical transmission microscopy. The initial layer of CVD can relax some of this tensile stress by deforming the underlying metal mandrel. However, succeeding overlayers of CVD can not relax these stresses.

Increasing demands are being put on as-grown CVD diamond. For instance, windows must have the highest possible transmission of laser light. The presence of grain boundaries, defects, dislocations, plastic strain and other sources of density fluctuation within the diamond window reduce its transmission, increase its absorption of incident radiation and reduce its thermal conductivity and decrease its mechanical toughness and strength. Absorption of laser energy creates heat with the window which must be drained through the diamond body to an adjacent heat sink in contact with the diamond part. If heat dissipation is rate limiting, the temperature of the window will increase causing distortion of the window-fixture and the entire window-mount to fail.

Polycrystalline diamond films prepared by CVD methods suffer from visual and mechanical defects associated with grain boundaries and growth defects including voids. In addition, residual stresses associated with the growth processes may be undesirable. Subsequent use of CVD polycrystalline diamond films in tool, electro-optical applications, and so on may be inhibited by the presence of these defects. Hence, to improve the utilization of CVD diamond, it is desirable to enhance the desirable properties of the diamond by addressing the aforementioned problems.

BRIEF SUMMARY OF THE INVENTION

Thermal annealing may be utilized for reducing density fluctuations within an imperfect single- or polycrystalline body. However, with diamond, temperatures required to anneal it at reasonable rates are necessarily so high that the kinetic stability of diamond is reduced and the diamond reverts to graphite thermodynamically unstable and spontaneously reverts to graphite. Graphitization usually occurs within the crystal body at defects, boundaries and microcracks, forming darkened regions within the body. This exacerbates density gradients and weakens the crystal and can crack and destroy the wafer. Heretofore, high temperature process for annealing CVD diamond so as to enhance the strength and desirable properties has not been adequately developed for CVD diamond.

According to a process as described in copending application, entitle Toughened Chemically Vapor Deposited Diamond by Anthony et al, Ser. No. 08/209,938, filed Mar. 11, 1994, now abandoned, stresses can be relieved by placing the CVD diamond in a hydrostatic environment in a high pressure/high temperature cell and exposing it to temperatures in the range of 1100° to 2300° C. and pressures of 45 to 100 kilobars. It is believed that the effects of this process are largely confined to plastic flow of the diamond.

Hence, a desirable advance in the art is to achieve enhanced stress reduction as set forth in the above application and avoid deleterious effects of graphitization which typically occurs during high temperature treatment of diamond.

In accordance with the present invention, there is provided a process for treating CVD diamond of the type having residual stresses and containing voids, said process comprising annealing said CVD diamond at temperature of above about 1000 degrees Centigrade for a suitable short period of time which decreases with increasing annealing temperature so as to prevent graphitization of said diamond and at a pressure less than the diamond-graphite equilibrium pressure but above a pressure sufficient to reduce the size of the voids.

BRIEF DESCRIPTION OF THE DRAWING

FIG. 1 also depicts the pressure-temperature phase diagram of carbon showing the diamond stable region above and the graphite stable region below the dotted diamond-graphite equilibrium line.

DETAILED DESCRIPTION

Figure 1:
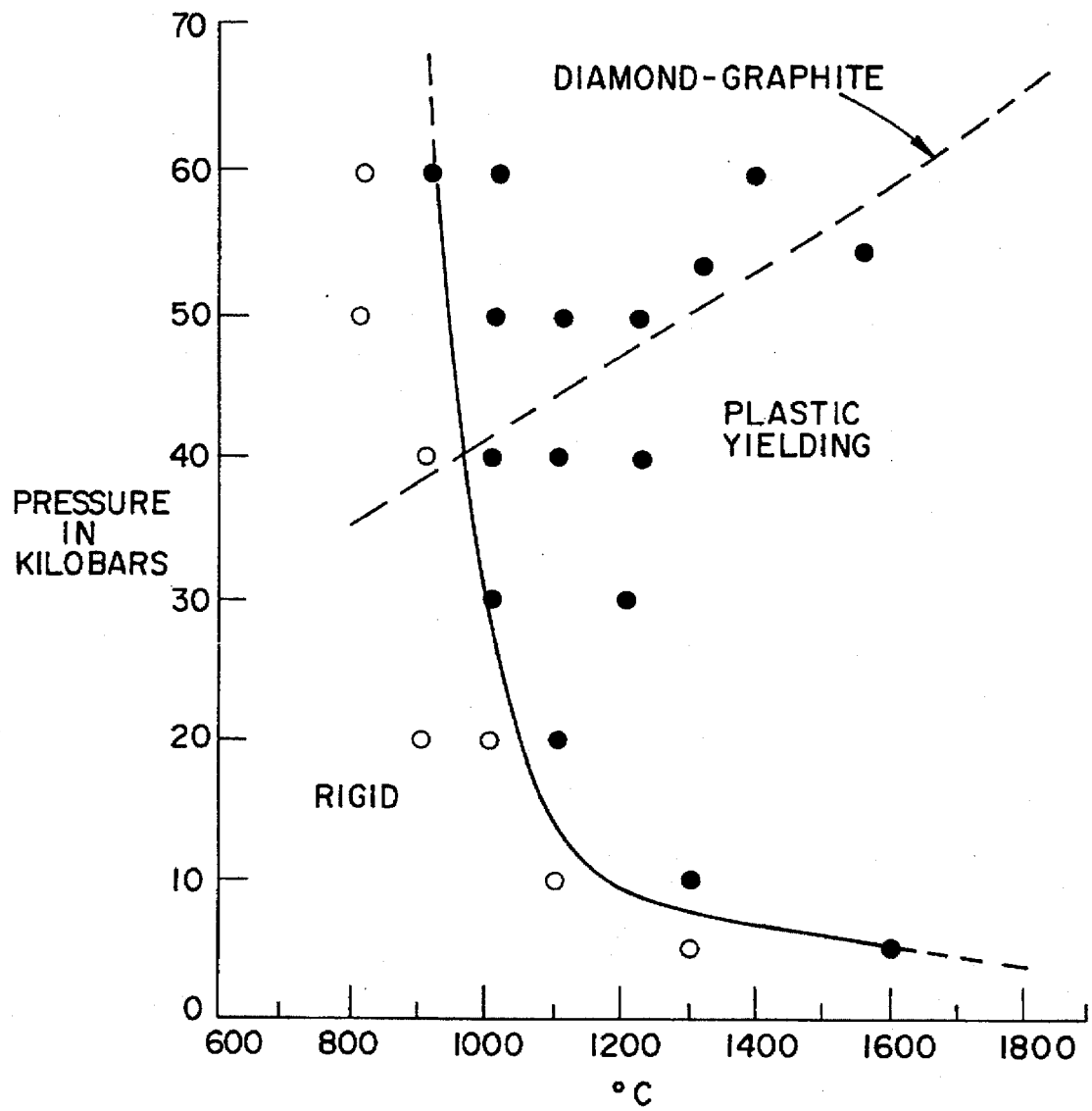
FIG. 1 shows a graph of the plastic yield strength of diamond in units of kilobars versus the temperature in centigrade from DeVries, Mat. Res. Bull, 10, 1193–1200 (1975). To the left of the yield-strength line, diamond is rigid and non-yielding while to the right of the yield-strength line, diamond can plastically yield.

A CVD diamond having enhanced properties characterized by reduced residual stress and compressed voids is formed by a post treatment of a starting low pressure produced CVD diamond. The starting CVD diamond utilized in the process of the present invention is a CVD diamond made by processes known in the art. Typically, processes for producing low pressure CVD diamond comprise microwave CVD, RFCVD, DCjet CVD, combustion flame CVD, or filament. A filament process for forming a CVD diamond substrate is set forth in U.S. Pat. No. 5,110,579 to Anthony et al. According to the processes set forth in the patent, diamond is grown by chemical vapor deposition on a substrate such as molybdenum by passing an appropriate mixture containing hydrogen and methane over a filament for an appropriate length of time to deposit a diamond film of the desired thickness.

It has been found that deposited diamond films are prone to deleterious stresses which detract from the final desirable properties of the diamond. However, the process of the present invention may enhance CVD diamond by relieving these stresses. When used as free-standing films, thicknesses greater than 200 microns are preferred for certain applications.

The starting CVD diamond typically contains voids which are produced during the diamond deposition. The voids contain gaseous constituents from the CVD deposition process. Gaseous constituents typically include hydrogen, nitrogen, oxygen, carbon dioxide, and carbon monoxide. In low-pressure deposited CVD diamond, the voids may be on the order of 200 microns although preferred higher quality diamond has voids less than 10 microns in diameter.

The presence of voids acts to weaken the material and deleteriously effect the desirable properties of the CVD diamond. Voids apparently originate from neighboring crystals growing over one another and shielding part of the crystal surface from further growth. These voids may also appear as a result of internal relief of the intrinsic stresses associated with CVD diamond films. As growth proceeds, these small caverns become buried in the CVD diamond film and form the voids that are seen later when a film is cross-sectioned. Some evidence of the origin of these voids comes from their size and internal surfaces. Generally, the void size is proportional to the crystal size of the material in which it is found. The internal surfaces of the void are usually faceted and indicate the crystal-growth origin of the voids.

CVD films are typically columnar and start out with a very fine grain size on the initial nucleation surface. The grain size gradually expands because of competitive grain growth from the initial growth surface to the final growth surface. Consequently, the void size also increases across the film in proportion to the corresponding increase in grain size. Hence, larger voids on the order of 50 microns are typically associated with crystal sizes of 200 micron and film thicknesses greater than 500 microns. Voids are typically seen along grain boundaries. Their grain boundary location is another consequence of their origin during crystal growth.

A preferred starting film as described in the above patent is substantially transparent columns of diamond crystals having a <110> orientation perpendicular to the base. Grain boundaries between adjacent diamond crystals having hydrogen atoms saturating dangling carbon bonds is preferred wherein at least 50 percent of the carbon atoms are believed to be tetrahedrally bonded based on Raman spectroscopy, infrared, NMR and X-ray analysis. It is also contemplated that H, F, Cl, O or other atoms may saturate dangling carbon atoms.

Preferably the starting CVD diamond films are produced by process in which the amount of impurities is at a very low level and the diamond CVD film consist entirely of diamond. Additional ingredients in the form of impurities and intentional additives are preferably present in amounts less than 4000 parts per million by weight, and more preferably less than 100 parts per million. The low level of impurities contributes to enhanced properties of the final CVD diamond having reduced density gradients.

The crystal size of the starting CVD diamond may vary greatly and is dependent on the nucleation of diamond. With an continued nucleation during the deposition process, sub-micron crystals of diamond may be attained. When the nucleation is limited to an initial nucleation at the substrate, elongated diamond crystals up to a length approximately equal to the film thickness may be formed.

The starting CVD diamond film preferably has a thermal conductivity of at least about 6 W/cm-K, more preferably at least about 9 W/cm-K, and most preferably at least about 12 W/cm-K. Thermal conductivity of the diamond film may be as high as about 21 W/cm-K. Techniques which can be used to measure thermal conductivity of the substantially transparent diamond film are by Mirage, shown by R. W. Pryor et al., proceedings of the Second International Conference on New Diamond Science and Technology, p 863 (1990).

The starting CVD diamond film preferably has good optical properties and can transmit light. These properties are preferred for producing a high quality CVD diamond having reduced density gradients. The polycrystalline nature of diamond can result in light scatter which can interfere with clarity. In addition, a material of high refractive index can reflect incident light which also contributes to a reduction in transmittance. Hence, a starting CVD diamond having desirable clarity and refractive index is preferred.

FIG. 1 shows a graph of the yield strength of diamond versus temperature that was found by R. C. DeVries. At the deposition temperatures of CVD diamond in the range of 750°–900° C., diamond is a brittle material that is not capable of plastically yielding, However, if the temperature is increased to a range above 1000° C., the yield strength of diamond decreases rapidly by over a factor of 10×. Thus, if CVD diamond is heated briefly into this range, the large deposition stresses can relax as plastic flow takes place and 90% of the stresses in CVD diamond can be eliminated.

During the high-temperature anneal, graphitization of diamond must be prevented while plastic flow is occurring. Hydrogen gas can be used as a graphitization suppressor in place of high pressure. Hydrogen allows diamond to be brought to temperatures as high as 2200° C. for short anneals. Preferred anneal time periods at this high temperature are preferably less than 2 minutes, to prevent graphitization. A carbon containing gas such as methane can be added to the hydrogen to make the chemical potential of carbon in the gas equal to that of graphite. This will prevent hydrogen etching of the CVD diamond during the anneal.

Alternatively, an inert atmosphere such as argon, neon or helium can be used. In these latter environments where graphitization of the diamond is not suppressed as in the hydrogen case, the annealing time at temperature should be even more limited to prevent graphitization. To prevent graphitization at 1800° C., the annealing time must be less than 60 minutes. At 1850° C., the maximum annealing time is 1.4 minutes and at 1900° C. the maximum annealing time is 15 minutes. The advantage of using a higher temperature in each case is that the residual stresses in the CVD diamond are less because the plastic yield stress of diamond is a decreasing function of temperature as shown in FIG. 1. The temperature is preferably greater than 1600, and less than 1900 degrees Centigrade. We can express the maximum time t(T) allowable for an anneal at a temperature T before graphitization of the CVD diamond will start as:

$$t(T)=1.27 \times 10^{-26} exp[127,328/T] \text{minutes} \qquad (1)$$

where T is the absolute temperature of the anneal in degrees Kelvin and t(T) is in units of minutes. The maximum annealing times vs annealing temperatures are also shown in Table I.

TABLE I

MAXIMUM ANNEALING TIMES VS TEMPERATURE

| TIME (MINUTES) | TEMPERATURE (K) | TEMPERATURE (°C.) |
|---|---|---|
| 3.49E+17 | 1273 | 1000 |
| 7.96E+15 | 1323 | 1050 |
| 2.39E+14 | 1373 | 1100 |
| 9.20E+12 | 1423 | 1150 |
| 4.41E+11 | 1473 | 1200 |
| 2.58E+10 | 1523 | 1250 |
| 1.81E+09 | 1573 | 1300 |
| 1.50E+08 | 1623 | 1350 |
| 1.44E+07 | 1673 | 1400 |
| 1.58E+06 | 1723 | 1450 |
| 1.96E+05 | 1773 | 1500 |
| 2.74E+04 | 1823 | 1550 |
| 4.24E+03 | 1873 | 1600 |
| 7.24E+02 | 1923 | 1650 |
| 1.35E+02 | 1973 | 1700 |
| 2.74E+01 | 2023 | 1750 |

TABLE I-continued

MAXIMUM ANNEALING TIMES VS TEMPERATURE

| TIME (MINUTES) | TEMPERATURE (K) | TEMPERATURE (°C.) |
|---|---|---|
| 6.01E+00 | 2073 | 1800 |
| 1.42E+00 | 2123 | 1850 |
| 3.56E–01 | 2173 | 1900 |
| 9.53E–02 | 2223 | 1950 |
| 2.70E–02 | 2273 | 2000 |
| 8.10E–03 | 2323 | 2050 |
| 2.55E–03 | 2373 | 2100 |
| 8.43E–04 | 2423 | 2150 |
| 2.91E–04 | 2473 | 2200 |
| 1.05E–04 | 2523 | 2250 |
| 3.94E–05* | 2573 | 2300 |

*3.94E–05 = 3.94 × $10^5$

In accordance with the principles of the present invention, it is desirable to reduce the size of voids in the starting CVD diamond so as to obtain CVD diamond with reduced density gradients. CVD diamond is typically grown in a low-pressure gas atmosphere of hydrogen and hydrocarbon and sometimes some additional gases such as oxygen. As a result, the voids in CVD diamond will contain these gases at low pressures and contribute to high density gradients. This is caused by a reduction in density of the diamond in the area of the void. Larger voids tend to cause a greater reduction in the density than smaller voids. Void shrinkage at elevated temperatures can occur spontaneously by diffusion of vacancies from the void to vacancy sinks such as grain boundaries, dislocations or free surfaces. Such shrinkage is driven thermodynamically by the reduction of free-surface energy of the void as the surface area of the void decreases with decreasing size. As the void shrinks, the pressure the residual gas in the void will increase until the driving force for shrinkage which is given by $\gamma/r$ is balanced by the gas pressure P in the void:

For more typical voids of about 20 microns in diameter, the final radius to which the void will shrink by vacancy diffusion is 1.73 microns at which point the gas pressure in the void will balance the surface tension of the void and vacancy diffusion will stop. The late stages of void shrinkage to this final radius will be very slow because of the reduction of driving force as the gas pressure in the void increases as the void shrinks. Generally, the shrinkage of voids by vacancy diffusion is a slow process. The long times involved are conducive to the spontaneous graphtization of diamond and are therefore not desirable.

Consequently, another mechanism of void elimination is needed such as plastic flow of the solid that can occur very rapidly. To obtain desirable enhance properties, it is preferred that the final CVD diamond, which has reduced density gradients, has void sizes of less than about 10 microns, preferably less than about 5 microns, and more preferably less than about 2 microns. As an idealization of the actual plastic collapse of voids in CVD diamonds, consider a spherical piece of CVD diamond of radius b with a void at its center with a radius a. If the CVD diamond is placed in a pressure vessel at a pressure P much greater than any residual gas pressure in the void, the radial $\sigma_r$ and the tangential $\sigma_t$ stresses in the CVD diamond are given by:

$$\sigma_r = P[b^3(R^3-a^3)/R^3(a^3-b^3)] \quad (2)$$

$$\sigma_t = P[b^3(2R^3+a^3)/2R^3(a^3-b^3)] \quad (3)$$

where R is the radial vector with its origin in the center of the void. Of greatest interest are the stresses near the surface of the void, i.e., at R=a. In this case, the radial stress $\sigma_r$ reduces to zero whereas the tangential stress $\sigma_t$ approaches 1.5P:

$$\sigma_r \rightarrow P[1-(a/R)^3] \rightarrow 0 \text{ as } R \rightarrow a \quad (4)$$

$$\sigma_t \rightarrow 1.5P \text{ as } R \rightarrow a \quad (5)$$

This result was derived by Lame in his Lecons sur La Theorie de L'Elasticite in Paris in 1852.

For diamond, the plastic yield strength varies with temperature. DeVries in his paper, Mat. Res. Bull., 10, 1193–1200 (1975) gives the variation of the plastic yield stress of diamond vs. temperature in his FIG. 5. In accordance with the principles of the present invention, it is desirable to be in a plastic yielding region which is below the DIAMOND-GRAPHITE line and above the plastic yield limit line. From this figure, the lines converge at a temperature of about 900° C. and a pressure of about 40 kilobars. As temperatures of annealing increase within this region, lower pressures may be utilized. At higher temperatures even lower pressures on the order of 5 kilobars may be utilized. Therefore, the diamond will plastically yield by slip around the cavity and the cavity will collapse and disappear. Slip will occur on the four family of planes of the (111) type in the <110> direction plus one additional plane to accommodate the polycrystalline nature of CVD diamond.

The starting diamond pieces may be placed in inert pressure-transmitting fluids or solids including salts or unreactive metals during the process. The inert medium which is preferably a non-oxidizing medium is at a pressure of less than the graphite-diamond equilibrium line at said temperature and preferably at a pressure greater than the plastic yield limit of diamond at said temperature.

The pressure medium used to transmit the pressure from the external surfaces where the force is generated to the diamond surfaces is critically important to the annealing process. The medium must transmit pressure without loss as a continuum onto diamond surfaces in the pressure apparatus. The medium must be thermally and chemically stable in that it can survive annealing conditions of temperature, pressure and time, in the presence of diamond surfaces, without itself being chemical degraded, participating in or catalyzing reactions, or causing dissolution or degradation of the diamond parts or pieces. Suitable media are stable fluids or gases at annealing conditions, or highly plastic solids, including, but not limited to, salts such as sodium chlorides, powdered oxides such as magnesium oxide or powdered carbons such as graphite. The medium must also be sealable to pressures and temperatures by known methods and possess a volume compressibility which is small and comparable to the gasketing system i.e, it must be void-free and close to its theoretical lattice density at annealing conditions. Pressure is preferably applied through a non-oxidizing medium selected from the group consisting of a noble gas, hydrogen, a salt, an inert powder or any inert substance capable of exerting substantially hydrostatic pressure at said temperatures and pressures.

In accordance with the present invention, the resulting CVD having reduced density gradients is densified at temperatures and pressures where, the resulting diamond is characterized by a reduction in the size of the voids. These voids are referred to a compressed voids. It is believed that the reduction in size of the voids is accompanied by an increase in gas pressure within the voids. Initially, the voids in the starting CVD diamond comprise gaseous material at a pressure approximating pressure of the CVD deposition. The final voids or compressed voids in the CVD diamond having reduced density gradients have an internal pressure approximating the pressure of densification.

The stress relief in the sample was also apparent by the strain that occurred in the sample during the anneal. Free-standing CVD diamond contains a stress gradient with the final growing surface in tension and the initial growing surface in compression. During the anneal, the free-standing film strained into a curved shape with the final growth surface being the concave surface and the initial growth surface being the convex surface. To prevent curling of CVD samples during stress anneals, the sample can be placed between two inert planar surfaces that are bolted in place. Examples of such inert materials that are rigid at the anneal temperature include graphite, Mo, W, Nb, Ti, Zr, boron nitride, SiC, MgO, $Al_2O_3$ and other such materials. At the temperature of the anneal, plastic flow of the diamond will release the stresses in the film while the inert planar surfaces will keep the film flat. Because the stresses are released while the film is held flat, the film on release from these constraints after the anneal will remain flat.

Because the CVD diamond is being annealed at pressures and temperatures below the diamond-graphite equilibrium line, lower pressures can be utilized than in our copending application Ser. No. 08/209,938, filed Mar. 11, 1994, where annealing is preferably carried out at pressures above the diamond-graphite line. For example, in the above application, pressures greater than 60 kilobars are typically required to anneal CVD diamond while in this application pressures as low as 5 kilobars can be utilized. There is a great economic advantge to operate at pressures lower than 20 kilobars where steel alloy fixtures can be used in place of expensive tungsten carbide parts in the pressure apparatus.

Upon removal of the diamond parts from the high temperature, medium pressure anneal, they are ready for fabrication into a electro-optical, acoustic, thermomechanical or mechanical devices by dicing, polishing or hole drilling by laser or mechanical means or to be implemented in whatever application they were originally intended.

As an alternative to the method described above, it may be desirable to shape, polish, or otherwise finish the diamond parts and then subsequently press. As an alternative to the method described above, annealing of three dimensional parts such as tubes, nozzles, beads, bearings, hemispheres, or other unusually shaped components may take place.

The present invention contemplates any sequence of events commencing with CVD diamond, and completion of part fabrication, in which one or more intermediate steps the treatment of the present invention takes place. The polishing, shaping, dicing and annealing sequence can occur in any order at the convenience of the processor.

The present invention also contemplates improving the properties of other types of diamond parts, including single and polycrystalline diamond, specifically including diamond wire dies, tools and wear parts including friction-reducing diamond surfaces, diamond windows, heat sinks, diamond electronic components including those doped at annealing conditions, diamond grit for saws, drills and grinding tools.

For wire die applications, it is desirable to utilized a high purity starting non-opaque CVD diamond that the final product will have desirable properties. Since the densified diamond resulting from the process of the present invention has a purity and other characteristics dependent on the starting diamond material, it is preferable to use a starting diamond with certain desirable characteristics so that the final densified diamond may be desirable used in applications requiring high quality diamond. Typically, thickness of the starting CVD diamond for preferred applications is from 0.01 to 10 millimeter, preferably from 0.3 to 1.2 millimeters. Preferred optical properties include an absorbance of less than about 1.6 $mil^{-1}$ when using light having a wavelength in the range between about 300 to 1400 nanometers. Over this range, the absorbance decreases linearly from about 1.6 $mil^{-1}$ to 0.2 $mil^{-1}$ as the wavelength increases from 300 to 1400 nanometers. The absorbance decreases from 0.2 $mil^{-1}$ to less than 0.1 $mil^{-1}$ as the wavelength increases from about 1400 nm to about 2400 nm.

As previously discussed, a preferred starting CVD diamond for optical applications typically has crystals with a <110> orientation perpendicular to the bottom surface. It is contemplated that the diamond grains may have a random orientation both parallel to the opening and perpendicular to the axial direction of the opening. If the grain size of the CVD diamond is sufficiently small, random crystallographic orientations may be obtained. A preferred starting CVD diamond film for optical applications has the properties described above including, grain boundaries between adjacent diamond crystals preferably have hydrogen atoms saturating dangling carbon bonds as illustrated in the patent. Preferred, starting CVD diamond has a hydrogen concentration of less than 2000, preferably less than 900 ppm. The concentrations of hydrogen in atomic percent are typically from 10 ppm to about 1000 ppm, preferably from about 10 ppm to 500 ppm. A preferred starting diamond body has no voids greater than 20, and preferably greater than 10 microns in diameter or inclusions of another material or carbon phase.

A preferred starting CVD diamond film for optical applications is non-opaque or transparent or translucent and contains oxygen in atomic percent greater than 1 part per billion. Undesirable impurities in the form of catalyst material, such as iron, nickel, or cobalt are preferably present in amounts less than 10 parts per million in atomic percent. These impurities are typically associated with competing high-pressure high-temperature diamond synthesis process. Nitrogen may be present in the CVD diamond film in atomic percent from between 0.1 to 1000 parts per million.

When preferred starting CVD diamond films are produced by deposition on substrates made of Si, Ge, Nb, V, Ta, Mo, W, Ti, Zr or Hf, by neutron activation analysis, we have found that small amounts of these substrate materials are incorporated into the CVD diamond films made on these substrates. Hence, the film may contain greater than 10 parts per billion and less than 10 parts per million of Si, Ge, Nb, V, Ta, Mo, W, Ti, Zr or Hf. Additionally, the film may contain more than one part per million of a halogen, i.e. fluorine, chlorine, bromine, or iodine. Additional additives may include N, B, O, and P which may be present in the form of intentional additives. These latter materials may be added as intentional additives to during CVD deposition such as by microwave diamond forming processes.

By way of further explanation, boron can be an intentional additive that is used to reduce intrinsic stress in the CVD diamond film or to improve the oxidation resistance of the film. Typically boron may present in atomic percent from between 1–4000 ppm. Preferably additives such as N, S, Ge, Al, and P, are each present at levels less than 100 ppm. It is contemplated that suitable films may be produced at greater levels. Lower levels of impurities tend to favor desirable properties of toughness and wear resistance. The most preferred films contain less than 5 parts per million and preferably less than 1 part per million impurities and intentional additives. In this regard, hydrogen and oxygen are not regarded as intentional additives or impurities since these ingredients are the result of the process. As previously set forth, the present invention contemplates production of such high purity starting CVD diamond by a variety of techniques such as microwave CVD, RFCVD, DCjet CVD, or combustion flame CVD.

We claim:

1. A process for treating an as-grown chemical vapor deposited (CVD) polycrystalline starting diamond film with a thickness of greater than 200 um and having residual starting stresses and containing voids, comprising the step of subjecting said diamond film to a temperature of above about 1000° C. and a hydrostatic pressure of above about 3 kilobars, said temperature and hydrostatic pressure are in the graphite-stable region, wherein graphitization of said polycrystalline diamond film is prevented and said voids are substantially reduced in size.

2. A process for treating polycrystalline CVD diamond film according to claim 1 wherein said pressure is applied through a non-oxidizing medium, said medium being selected from the group consisting of a noble gas, hydrogen, a salt, an inert powder or any inert substance capable of supporting substantially hydrostatic pressure at said temperatures and pressures.

3. A process for treating polycrystalline CVD diamond film according to claim 1 wherein said time period for annealing is approximated by the formula:

$$t(T) = 1.27 \times 10-26 exp(127,328/T) \text{ minutes}$$

where T is the absolute temperature in degrees Kelvin.

4. A process for treating polycrystalline CVD diamond film according to claim 1 wherein the temperature is less than 1600 degrees Centigrade.

5. A process for treating polycrystalline CVD diamond film according to claim 4 wherein the temperature is greater than 1900 degrees Centigrade.

6. A process for treating polycrystalline CVD diamond film according to claim 1 comprising wherein said resulting annealed CVD diamond film has reduced stresses.

7. A process of treating polycrystalline CVD diamond film according to claim 6 wherein said polycrystalline diamond film comprises substantially transparent columns of diamond crystals having an orientation selected from the group consisting of the <110>, the <100> and the <111> directions perpendicular to a base.

8. A process for treating polycrystalline CVD diamond film according to claim 1 wherein said starting polycrystalline diamond film has diamond crystals and grain boundaries between diamond crystals and is optically transparent.

9. A process for treating polycrystalline CVD diamond film according to claim 1 wherein said starting diamond film comprises impurities or intentionally additives in amounts less than 4000 parts per million.

10. A process for treating polycrystalline CVD diamond film according to claim 1 wherein said starting diamond film comprises diamond having a grain size of crystals of less than about 200 microns.

11. A process for treating polycrystalline CVD diamond film according to claim 1 wherein said starting diamond film comprises impurities or intentionally additives in amounts less than less than 100 parts per million.

* * * * *